United States Patent
Kim et al.

(10) Patent No.: US 12,389,534 B2
(45) Date of Patent: Aug. 12, 2025

(54) SYSTEMS AND METHODS FOR NONINVASIVE ACOUSTIC NOISE REDUCTION IN ELECTRONIC DEVICES

(71) Applicant: Microsoft Technology Licensing, LLC, Redmond, WA (US)

(72) Inventors: Donghwi Kim, Kirkland, WA (US); Jaejin Lee, Beaverton, OR (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/565,259

(22) Filed: Dec. 29, 2021

(65) Prior Publication Data
US 2023/0217585 A1 Jul. 6, 2023

(51) Int. Cl.
*H05K 1/02* (2006.01)
*H05K 1/11* (2006.01)
*H05K 1/18* (2006.01)

(52) U.S. Cl.
CPC ............. *H05K 1/0271* (2013.01); *H05K 1/11* (2013.01); *H05K 1/18* (2013.01); *H05K 2201/2045* (2013.01)

(58) Field of Classification Search
None
See application file for complete search history.

(56) References Cited

U.S. PATENT DOCUMENTS

| | | | |
|---|---|---|---|
| 4,063,788 A | 12/1977 | Latasiewicz et al. | |
| 4,067,531 A * | 1/1978 | Sikula | F02B 77/13 277/916 |
| 5,044,338 A * | 9/1991 | Shelton | F02M 69/465 123/456 |
| 5,958,556 A * | 9/1999 | McCutcheon | H05K 1/0271 428/416 |
| 6,021,706 A * | 2/2000 | Seguenot | A47J 31/0663 99/302 R |
| 6,288,866 B1 * | 9/2001 | Butler | G11B 33/08 |
| 8,213,174 B1 * | 7/2012 | Kapahi | G06F 1/183 361/759 |
| 9,165,852 B2 * | 10/2015 | Terasawa | H05K 7/1432 |
| 10,561,039 B2 * | 2/2020 | Hannig | H05K 7/1417 |
| 2003/0058627 A1 * | 3/2003 | Paquin | H05K 7/142 361/758 |
| 2010/0246147 A1 * | 9/2010 | Qin | H05K 5/0217 361/758 |
| 2011/0108312 A1 | 5/2011 | Becze et al. | |
| 2014/0076621 A1 | 3/2014 | Arnold et al. | |

(Continued)

FOREIGN PATENT DOCUMENTS

DE 102019135429 A1 6/2021

OTHER PUBLICATIONS

"International Search Report issued in PCT Application No. PCT/US22/044657", Mailed Date : Jan. 9, 2023, 18 Pages.

(Continued)

*Primary Examiner* — Ishwarbhai B Patel
(74) *Attorney, Agent, or Firm* — Ray Quinney & Nebeker P.C.; Paul N. Taylor

(57) ABSTRACT

A device for reducing acoustic vibration in an electronic device includes a noninvasive fastener configured to fix a printed circuit board (PCB) to a mechanical ground, and the noninvasive fastener provides vibrational dampening in both compression and tension.

21 Claims, 8 Drawing Sheets

(56) References Cited

U.S. PATENT DOCUMENTS

| | | |
|---|---|---|
| 2014/0198472 A1 | 7/2014 | Qin et al. |
| 2014/0233188 A1 | 8/2014 | Terasawa et al. |
| 2015/0070864 A1 | 3/2015 | Rainer et al. |
| 2015/0364253 A1 | 12/2015 | Arnold et al. |
| 2018/0054912 A1 | 2/2018 | Hannig |
| 2019/0297724 A1* | 9/2019 | Chiu .................. H05K 1/181 |

OTHER PUBLICATIONS

Ceramic Capacitor—MLCC Solutions for Suppressing Acoustic Noise in the Battery Lines of Laptop Computers, Retrieved from: https://www.murata.com/en-us/products/capacitor/ceramiccapacitor/library/apps/notepc, Nov. 11, 2021, 12 Pages.

Ma, Herb Te-Jen, "Reduce the Acoustic Noise Effect from Class II MLCC Vibration-", Retrieved from: https://www.electronicdesign.com/technologies/analog/article/21154968/samsung-reduce-the-acoustic-noise-effect-from-class-ii-mlcc-vibration, Feb. 25, 2021, 12 Pages.

Sun, et al., "Measurement Methodologies for Acoustic Noise Induced by Multilayer Ceramic Capacitors of Power Distribution Network in Mobile Systems", In Journal of IEEE Transactions on Electromagnetic Compatibility, vol. 62, Issue 4, Aug. 2020, pp. 1515-1523.

Sun, et al., "Simulation Investigation on Acoustic Noise Caused by "Singing" Capacitors on Mobile Devices", In Proceedings of the International Symposium on Electromagnetic Compatibility, Signal & Power Integrity, Jul. 22, 2019, pp. 406-410.

Zhao, Mingyue, "How to Reduce Acoustic Noise of MLCCs in Power Applications", Retrieved from: https://e2e.ti.com/blogs_/b/powerhouse/posts/how-to-reduce-acoustic-noise-of-mlccs-in-power-applications, Aug. 9, 2016, 5 Pages.

* cited by examiner

SYSTEMS AND METHODS FOR NONINVASIVE ACOUSTIC NOISE REDUCTION IN ELECTRONIC DEVICES

BACKGROUND

Background and Relevant Art

Electronic devices, such as personal computing devices, server computing devices, handheld computing devices, and gaming consoles, include a plurality of electronic components on a printed circuit board (PCB). The electronic components produce vibrations that are translated into harmonic oscillations of the PCB. The vibrations of the PCB create noise audible to a user.

BRIEF SUMMARY

In some embodiments, a device for reducing acoustic vibration in an electronic device includes a noninvasive fastener configured to fix a printed circuit board (PCB) to a mechanical ground, and the noninvasive fastener provides vibrational dampening in both compression and tension.

In some embodiments, a system for reducing acoustic vibrations in an electronic device includes a first chassis portion, a PCB, and a noninvasive fastener. The PCB is fixed to the first chassis portion. The noninvasive fastener is fastened to a surface of the PCB. The noninvasive fastener is configured to dampen an acoustic vibration of the PCB relative to the first chassis portion in both compression and tension.

In some embodiments, a method of reducing acoustic vibrations in an electronic device includes obtaining an electronic device including at least one vibrating electronic component on a PCB, wherein the PCB is coupled to a chassis, operating the electronic device to induce acoustic vibration in the PCB, measuring an acoustic vibration level at a plurality of positions on the PCB, applying a noninvasive fastener to the PCB based at least partially on the acoustic vibration level measured at one or more of the plurality of positions on the PCB, and dampening at least a portion of the acoustic vibrations with the noninvasive fastener.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-2 is a side schematic view of the electronic device of FIG. 1-1 with a supplementary invasive fastener;

FIG. 2 is a side schematic view of an electronic device with a PCB fastened by noninvasive fasteners, according to at least one embodiment of the present disclosure;

FIG. 8-1 is a representation of vibrational information of the PCB of FIG. 7 in a $10^{th}$ harmonic mode, according to at least one embodiment of the present disclosure;

FIG. 8-2 is a representation of vibrational information of the PCB of FIG. 7 in a $10^{th}$ harmonic mode with noninvasive fasteners added, according to at least one embodiment of the present disclosure;

FIG. 9-1 is a representation of vibrational information of the PCB of FIG. 7 in a $20^{th}$ harmonic mode, according to at least one embodiment of the present disclosure;

FIG. 9-2 is a representation of vibrational information of the PCB of FIG. 7 in a $20^{th}$ harmonic mode with noninvasive fasteners added, according to at least one embodiment of the present disclosure;

FIG. 10-1 is a representation of vibrational information of the PCB of FIG. 7 in a $32^{nd}$ harmonic mode, according to at least one embodiment of the present disclosure;

FIG. 10-2 is a representation of vibrational information of the PCB of FIG. 7 in a $32^{nd}$ harmonic mode with noninvasive fasteners added, according to at least one embodiment of the present disclosure;

DETAILED DESCRIPTION

The present disclosure relates generally to systems and methods for reducing acoustic vibration in an electronic device. More particularly, the present disclosure relates to reducing acoustic vibrations in a printed circuit board (PCB) caused by one or more electronic components affixed to the PCB deforming. In some embodiments, multi-layer chip capacitors (MLCC) and other components of the electronic device deform as electric fields are applied to the components. For example, the capacitor dielectric layers can deform in response to a change in the electric field direction, causing an MLCC surface to repeatedly shrink and expand with an applied alternating current (AC) voltage. This vibration event can transfer to the PCB substrate via solder or other attachment mechanisms.

In some embodiments, the vibration source is a processor, such as a central processing unit (CPU), a graphical processing unit (GPU); a storage device, such as random-access memory (RAM), other volatile memory, nonvolatile memory, or combinations thereof, a network device; a power source; or other components of the electronic device. In some processors, a fully integrated switching regulator is integrated inside of a CPU or GPU. In some scenarios of CPU/GPU load, the integrated switching regulator's switching behavior falls into an acoustic range. In such examples, the PCB-mounted ceramic capacitors used for those integrated switching regulators vibrate. In some embodiments, such an integrated switching regulator uses one or more ceramic decoupling capacitors and locates them underneath the CPU package or GPU package, which can be a vibration source. The processor load, in some cases, is electrically very hard to control and/or out of control.

Because the electronic components expand and shrink with AC voltage, the movement of the electronic component can be translated into flex of the PCB. In some instances, the flex of the PCB can produce harmonic effects or other acoustic vibrations, such as in a range of 20 Hertz (Hz) to 20000 Hz, some of which may be audible to a user. Because the acoustic vibrations are harmonic effects of the combination of the electronic components on the PCB and the previously chosen fixation points to the chassis (e.g., screw locations to the chassis mounts), correcting the acoustic vibrations can be difficult.

In some embodiments, a noninvasive fastener according to the present disclosure allows the dampening of vibration in both tension and compression at substantially any location on the PCB without requiring a through-hole used in a conventional chassis mount location.

Figure 1:
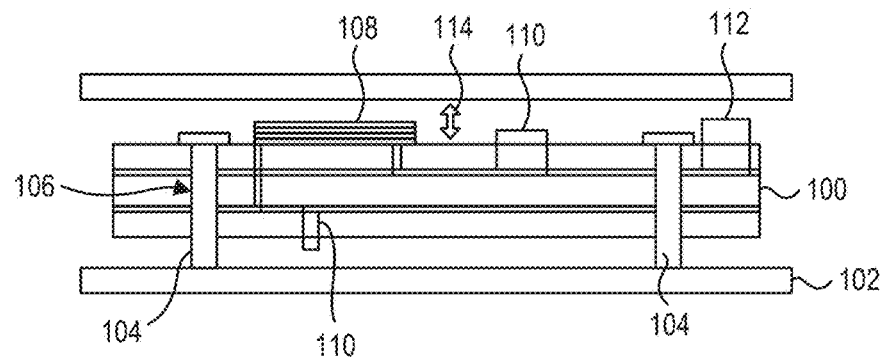
FIG. 1-1 is a side schematic view of an electronic device with a printed circuit board (PCB)

FIG. 1-1 is a side schematic view of a PCB 100 with vibration sources affixed thereto. The PCB is fixed to a chassis 102 by screws 104. The screws 104 are located in through-holes 106 through the PCB 100 to mount the PCB 100 to the chassis 102.

Vibration sources, on both sides of the PCB 100, can flex the PCB 100 and introduce acoustic vibrations. The screws 104 through the PCB 100 act as anchored points about which the vibration modes of the PCB 100 can oscillate. The vibration sources include, in various embodiments, an MLCC 108, one or more capacitors 110 such as decoupling capacitors, integrated switching regulators, voltage regulation modules (VRM) 112, other integrated circuit (IC) devices, and other electronic components with AC voltages. The vibration sources can create harmonic oscillations 114 in the PCB 100 relative to the screws 104 that create audible noise for a user.

Figures 1, 2:
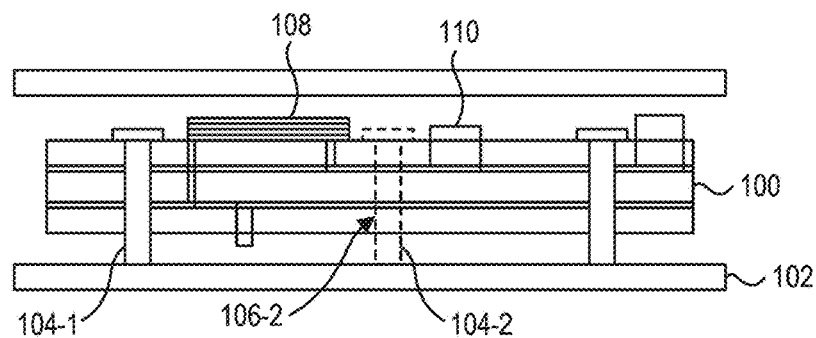
Figure 2:
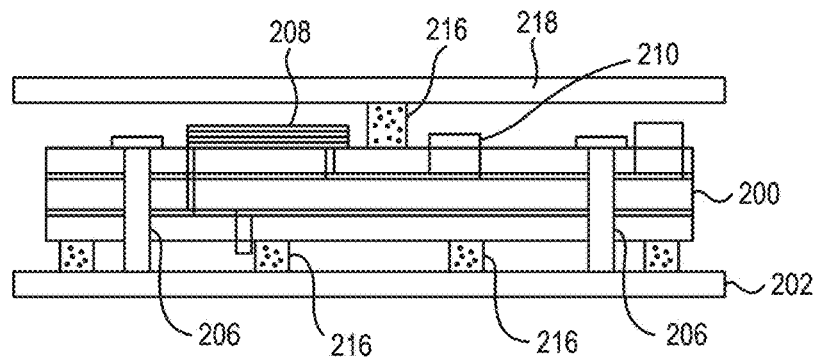

The harmonic oscillations 114 can be reduced by limiting and/or preventing movement of the PCB 100 relative to the chassis 102. FIG. 1-2 is a side schematic view of the PCB 100 of FIG. 1-1 with a supplementary through-hole 106-2 added through the PCB 100 in addition to the pre-existing through-holes 106-1. In some embodiments, a supplementary through-hole 106-2 can fix a portion of the PCB 100 to the chassis 102 with a supplementary screw 104-2 in addition to the pre-existing screws 104-1. The MLCC 108 and/or capacitor(s) 110 are located proximate to the supplementary screw 104-2, but the MLCC 108 and/or capacitor(s) 110 remain positioned between fixation points of the PCB 100, allowing the PCB 100 to flex and oscillate between the fixation points (e.g., pre-existing screw(s) 104-1 and supplementary screw(s) 104-2). In some embodiments, each supplementary screw 104-2 and/or through-hole 106-2 consumes area on the PCB 100, which is needed to make the PCB 100 and associated electronic device as small as possible for design, efficiency, and portability. In some embodiments, the PCB 100 and electronic components connected thereto have an existing design, layout, and fabrication process, and adding supplementary through-hole 106-2 is not a viable option due to time constraints or economic constraints.

At least some embodiments of a noninvasive fastener according to the present disclosure can provide greater flexibility in placement and/or performance than adding a supplementary through-hole, which allows for greater reduction in acoustic vibration. FIG. 2 is a side schematic view of an embodiment of a PCB 200 with noninvasive fasteners 216 affixed to the PCB 100 and a mechanical ground (a chassis 202, cover 218, etc.).

A noninvasive fastener 216, in some embodiments, is fastened to a surface of the PCB 200 without a through-hole 206. In some embodiments, the noninvasive fastener 216 has a connection strength with the surface of the PCB 200 of at least 200 pounds per square inch (psi). In some embodiments, the noninvasive fastener 216 has a connection strength with a surface of the mechanical ground of at least 200 psi. In some embodiments, the noninvasive fastener 216 has a connection strength with both the surface of the PCB 200 and the surface of the mechanical ground of at least 200 psi.

The noninvasive fastener 216 may be fastened to the surface of the PCB 200 and/or the mechanical ground through a variety of connection methods. In some embodiments, the noninvasive fastener 216 is fastened to the PCB 200 with an adhesive therebetween. In some embodiments, the noninvasive fastener 216 is fastened to the PCB 200 by a magnetic attraction. In some examples, a first portion of the noninvasive fastener 216 is fixed to the PCB 200, a second portion of the noninvasive fastener 216 is fixed to the mechanical ground, and the first portion and second portion are magnetically attracted to one another. In some embodiments, the noninvasive fastener 216 is fastened to the PCB 200 by an adherence of the noninvasive fastener 216 itself, such as an elastomeric noninvasive fastener 216 that bonds directly to the surface of the PCB 200 without an additional adhesive.

In some embodiments, the noninvasive fastener 216 is affixed to any portion of the surface of the PCB 200 and does not require a through-hole 206 through the PCB 200. Because a noninvasive fastener 216 according to the present disclosure does not require a through-hole 206, the noninvasive fastener 216 is connectable to a surface of the PCB 200 directly opposite a vibration source. In other words, a noninvasive fastener 216 can be positioned underneath a vibration source and dampen acoustic vibration of the vibration source, such as an MLCC 208 or capacitor 210 that cannot have a screw 204 or other invasive fasteners positioned therethrough.

Figure 3:
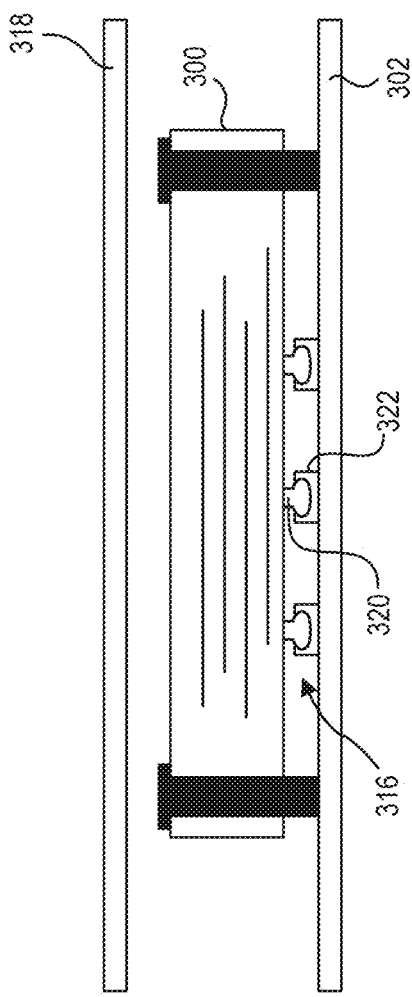
FIG. 3 is a side schematic view of an electronic device with a PCB fastened by noninvasive mechanical fasteners, according to at least one embodiment of the present disclosure.

FIG. 3 is a side view of an embodiment of a PCB 300 with a plurality of noninvasive mechanical fasteners 316. In some embodiments, the noninvasive fastener 316 is a mechanical fastener that includes a mechanical connection between a first portion 320 and second portion 322 of the noninvasive fastener 316. In some examples, the mechanical connection is a snap fit that allows the first portion 320 of the noninvasive fastener 316 to be fastened to a surface of the PCB 300 and a second portion 322 of the noninvasive fastener 316 to be fastened to the mechanical ground.

In some embodiments, the first portion 320 and second portion 322 of the noninvasive fastener 316 are positioned on the PCB 300 and mechanical ground (e.g., the chassis 302) prior to assembly of the PCB 300 in the chassis 302. In some embodiments, a snap fit noninvasive fastener 316 can allow the PCB 300 to be selectively installed, removed, repaired, or replaced from the chassis 302 and/or electronic device without damaging the noninvasive fastener 316 and replacing the noninvasive fastener 316.

In some embodiments, the noninvasive fasteners 316 (e.g., a first portion 320 of the noninvasive fastener 316) are positioned on one side of the PCB 300 to selectively fasten the PCB 300 to the mechanical ground upon installation of the PCB 300 in the chassis 302. In some embodiments, the noninvasive fasteners 316 are positioned on both sides of the PCB 300 to allow the PCB 300 to be fixed to a plurality of mechanical grounds (e.g., the chassis 302 and the cover 318) while still allowing the cover 318, PCB 300, and chassis 302 to be separated for repairs and/or maintenance of the electronic device.

The noninvasive fastener 316 with a first portion 320 and a second portion 322, in some embodiments, includes different materials for the first portion 320 and the second portion 322. For example, a first portion 320 may be an elastomeric material that is vibration dampening to limit and/or prevent transmission of acoustic vibrations from the PCB 300 to the chassis 302, and the second portion 322 may be a rigid material, such as metal, that allows for increased durability. In such an embodiment, the first portion 320 can be fastened to the PCB 300 with an adhesive therebetween, while the second portion 322 can be welded to the chassis 302. In other embodiments, the chassis 302 is a milled or machined bucket, and the second portion 322 of the noninvasive fastener 316 is integrally formed with the chassis 302 when the chassis 302 is milled or machined from a billet.

As described herein, the noninvasive fastener 316 has a connection tensile strength of at least 200 psi with a surface of the PCB 300 and with the mechanical ground. The tensile strength of the snap fit connection therebetween is less than the connection strength, but no less than 160 psi. Such embodiments of a tensile strength of the snap fit allows dampening of the vibration in both compression and tension, while enabling the first portion 320 and second portion 322 of the noninvasive fastener 316 to be disconnected upon repair or replacement of the PCB 300.

Figure 4:
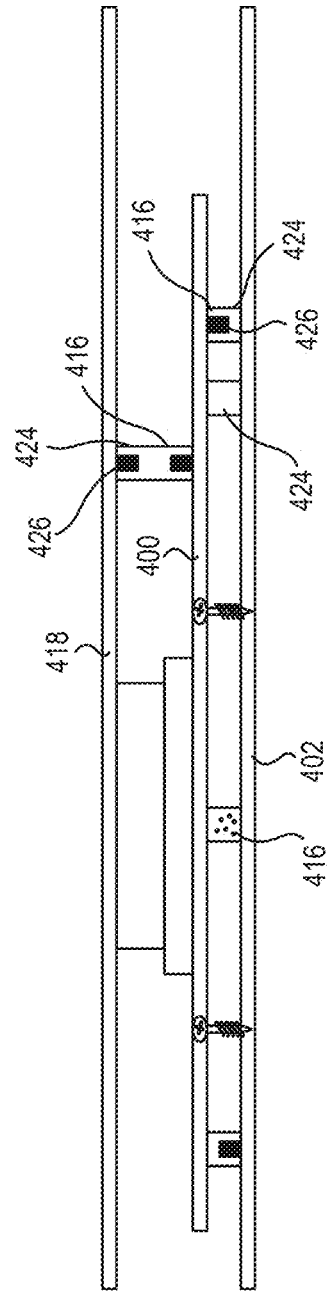
FIG. 4 is a side schematic view of an electronic device with a PCB fastened by noninvasive elastomeric fasteners, according to at least one embodiment of the present disclosure.

In some embodiments, the noninvasive fastener is an elastomeric fastener that bonds to one or more of the PCB and the mechanical ground, and the elastomeric material is vibration dampening. FIG. 4 is a side view of an embodiment of a PCB 400 with a plurality of noninvasive elastomeric fasteners 416.

In some embodiments, the noninvasive fasteners 416 are positioned on one side of the PCB 400 to selectively fasten the PCB 400 to the mechanical ground. In some embodiments, the noninvasive fasteners 416 are positioned on both sides of the PCB 400 to allow dampening in compression and tension simultaneously. For example, a noninvasive fastener 416 is fastened to a first surface of the PCB 400 proximate a chassis 402, and another noninvasive fastener 416 is fastened on a second surface of the PCB 400 opposite the first surface and proximate a cover 418. In some embodiments, the noninvasive fasteners 416 are directly opposite one another. In some embodiments, the noninvasive fasteners 416 are positioned on opposite sides but laterally displaced from one another.

The noninvasive fastener 416, in some embodiments, is a singular piece of elastomeric material. In other embodiments, the noninvasive fastener 416 is partially an elastomeric material 424 and a partially a rigid material 426, such as a PCB spacer or motherboard spacer. The rigid material 426 can provide additional strength and/or laterally stability to the noninvasive fastener 416 that is greater than that of a noninvasive fastener that is elastomeric material 424 only. In some examples, the rigid material 426 increases the shear strength of the noninvasive fastener 416 to be greater than that of a noninvasive fastener that is elastomeric material 424 only.

The noninvasive fastener 416 may be made of or include polymers, such as ethylene vinyl acetate, styrene-isoprene-styrene, styrene-butadiene-styrene, polyethylene, polyamides, ethylene acrylic copolymers, polypropylenes, phenoxy resins, polyesters, polyesteramides, polyurethanes, butyl rubbers, polyvinyl acetate, etc. In some embodiments, the noninvasive fastener 416 includes or is made of a hot-melt adhesive. The hot-melt adhesive has a melting temperature of no less than 90° C. In some embodiments, the noninvasive fastener 416 is adhered to the mechanical ground with a separate adhesive with a melting temperature no less than 90° C.

In some embodiments, the connection tensile strength of the noninvasive fastener 416 to the PCB 400 is at least 200 psi. In some embodiments, the connection tensile strength of the noninvasive fastener 416 to the PCB 400 is at least 300 psi. In some embodiments, the connection tensile strength of the noninvasive fastener 416 to the PCB 400 is at least 400 psi.

In some embodiments, the connection tensile strength of the noninvasive fastener 416 to the mechanical ground (e.g., chassis 402, cover 418) is at least 200 psi. In some embodiments, the connection tensile strength of the noninvasive fastener 416 to the mechanical ground is at least 300 psi. In some embodiments, the connection tensile strength of the noninvasive fastener 416 to the mechanical ground is at least 400 psi.

In some embodiments, the tensile strength of the noninvasive fastener 416 is less than the connection tensile strength of the noninvasive fastener 416 to the surfaces. In some embodiments, the tensile strength of the noninvasive fastener 416 is at least 160 psi. In some embodiments, the tensile strength of the noninvasive fastener 416 is at least 200 psi. In some embodiments, the tensile strength of the noninvasive fastener 416 is at least 250 psi.

Depending on the material of the cover 418 and/or the chassis 402, the type of noninvasive fastener 416 and/or the type of connection between the noninvasive fastener 416 and the PCB and mechanical ground can be different. In at least one example, a PCB 400 is connected to the chassis 402 with a different type of noninvasive fastener 416 than the PCB 400 is connected to a cover 418. In another example, noninvasive fastener 416 is connected to the PCB 400 with a different connection type than the noninvasive fastener 416 is connected to the mechanical ground.

Figure 5:
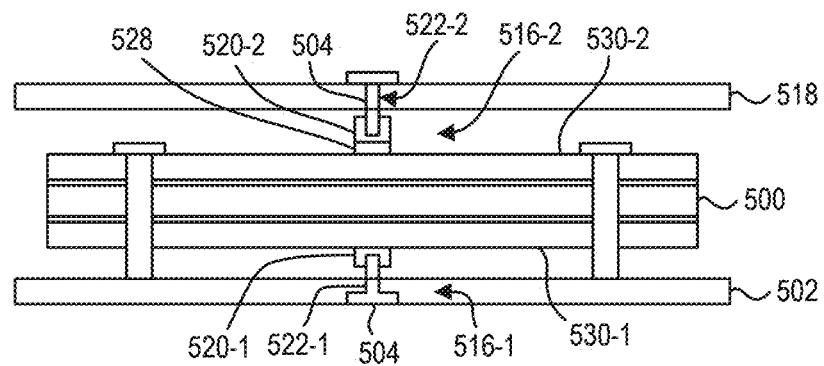
FIG. 5 is a side schematic view of an electronic device with a PCB fastened by noninvasive fasteners on opposite sides of the PCB, according to at least one embodiment of the present disclosure.

FIG. 5 is a side view of another embodiment of a PCB 500 that is mechanically grounded to a chassis 502 and a cover 518 by noninvasive fasteners 516-1, 516-2. The noninvasive fasteners 516-1, 516-2 are fastened to a surface of the PCB 500 without a through-hole in the PCB, however, the noninvasive fasteners 516-1, 516-2 include at least a portion that is positioned in a through-hole in the mechanical ground.

In some embodiments, the intended fixation point on the PCB 500 is not able to have a through-hole positioned therein to receive a conventional screw fastener, but the chassis 502 or cover 518 can have a through-hole therein. In some embodiments, a first portion 520-1 of a first noninvasive fastener 516-1 is bonded directly to a surface of the PCB 500, such as when the first portion 520-1 of the first noninvasive fastener 516-1 is or includes an elastomeric material. The first portion 520-1 of the first noninvasive fastener 516-1 has a mechanical connection, such as threads, thereon, to which the second portion 522-1 of the first noninvasive fastener 516-1 can mechanically connect. In some embodiments, the second portion 522-1 of the first noninvasive fastener 516-1 is a screw 504 that is inserted through the chassis 502 to thread into and mechanically connect with the first portion 520-1 of the first noninvasive fastener 516-1.

The second noninvasive fastener 516-2 also includes a second portion 522-2 that is a screw 504, and the first portion 520-2 of the second noninvasive fastener 516-2 is fastened to the PCB 500 with an adhesive layer 528 therebetween. For example, the surface material or finish of a first surface 530-1 of the PCB 500 can be different from the surface material or finish of an opposite second surface 530-2 of the PCB 500. The elastomeric material of the first portion 520-2 of the second noninvasive fastener 516-2 may not bond with a connection tensile strength of at least 200 psi, and the adhesive layer 528 can provide a stronger connection tensile strength between the second surface 530-2 and the first portion 520-2 of the second noninvasive fastener 516-2.

Figure 6:
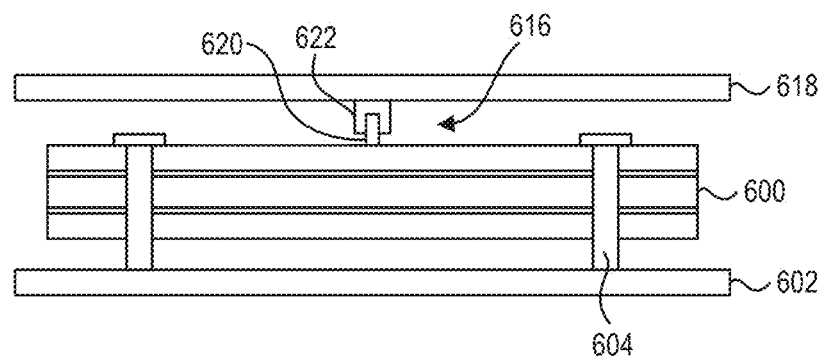
FIG. 6 is a side schematic view of an electronic device with a PCB fastened by a two-part noninvasive fastener, according to at least one embodiment of the present disclosure.

FIG. 6 is a side view of another embodiment of a PCB 600 that is vibrationally dampened relative to a mechanical ground. In some embodiments, the noninvasive fastener 616 is configured to facilitate assembly of the electronic device. For example, the PCB 600 is fastened to the chassis 602 using a plurality of screws 604 through the PCB 600 into the chassis 602. Because the PCB 600 exhibits acoustic vibration, a noninvasive fastener 616 is connected between the PCB 600 and a cover 618. The cover 618 is installed after the PCB 600 is affixed to the chassis 602.

In some embodiments, a first portion 620 of the noninvasive fastener 616 is fastened to the PCB 600, and a second portion 622 of the noninvasive fastener 616 is fastened to the cover 618. During assembly (or reassembly) of the electronic device, the cover 618 is subsequently installed over the PCB 600 and pressed downward toward the PCB 600. The first portion 620 of the noninvasive fastener 616 complementarily mates with the second portion 622 of the noninvasive fastener 616 in a press fit and/or friction fit. A force applied to the cover 618 to assemble the electronic device also urged the first portion 620 and second portion 622 of the noninvasive fastener 616 into mechanical connection, which fastens the PCB 600 to the cover 618 to reduce acoustic vibration in the PCB 600. In devices with known acoustic vibrations, such a noninvasive fastener 616 positioning and assembly process can allow some embodiments of noninvasive fasteners according to the present disclosure to be retrofit onto the existing electronic device, improving the acoustic performance of the device without requiring a redesign of the PCB 600 or chassis 602.

Figure 7:
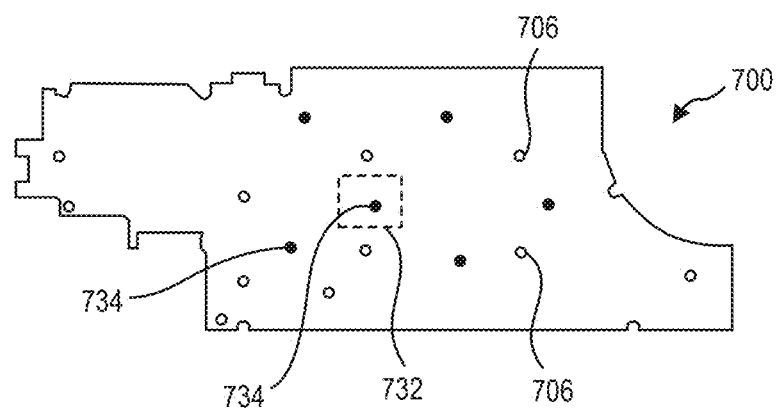
FIG. 7 is a top view of a PCB with through-holes therein, according to at least one embodiment of the present disclosure.

For example, FIG. 7 is a top view of an existing PCB 700 with through-holes 706 for invasive fasteners. In some embodiments, a processor 732 is positioned on the PCB 700 between the through-holes 706 for invasive fasteners, because the invasive fasteners cannot by located overlapping the processor 732 in the plane of the PCB 700. In some embodiments, one or more noninvasive fixation points 734 are positioned at least partially overlapping a vibration source, such as a processor 732, on a PCB 700. In some examples, a noninvasive fixation point 734 is at least partially overlapping a vibration source when part of the noninvasive fixation point 734 is within the area of the vibration source on the plane of the PCB 700. The plane of the PCB 700 should be understood to be the plane in which the surface of the PCB 700 lies. In some embodiments, a PCB may be nonplanar, in which case, the plane of the PCB 700 should be understood to follow at least one curve or discontinuity of the nonplanar PCB 700.

FIG. 8-1 through 10-2 are example of acoustic vibration amplitudes in simulations performed at different harmonic modes of the PCB 700 of FIG. 7 using only invasive fasteners to a chassis in the through-holes 706 (in FIGS. 8-1, 9-1, and 10-1) compared to using invasive fasteners to the chassis in the through-holes 706 with noninvasive fasteners to the chassis at noninvasive fixation points 734 (in FIGS. 8-2, 9-2, and 10-2). The area of interest 736 is the approximate center of the PCB 700, as oscillations of the PCB 700 in the volume in the center of the PCB 700 have the greatest influence on audible vibrations.

Figures 1, 8:
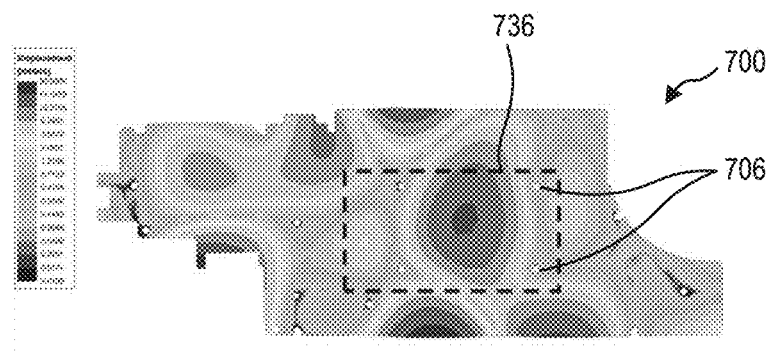
Figures 2, 8:
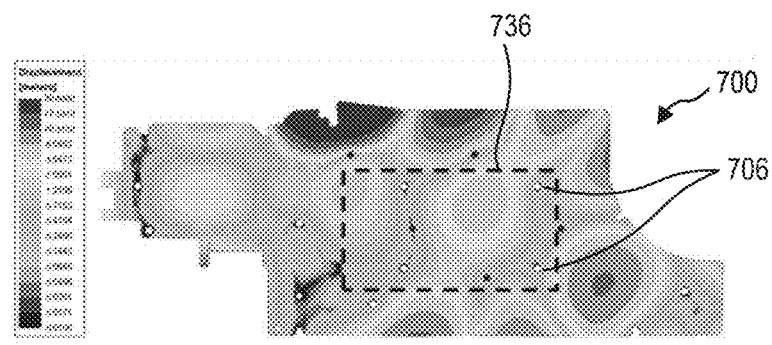
Figures 1, 9:
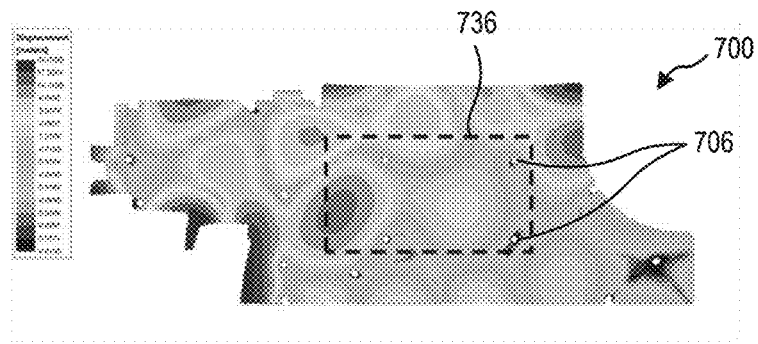
Figures 2, 9:
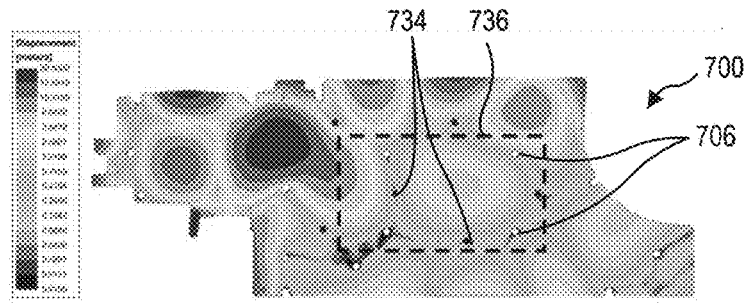
Figures 1, 10:
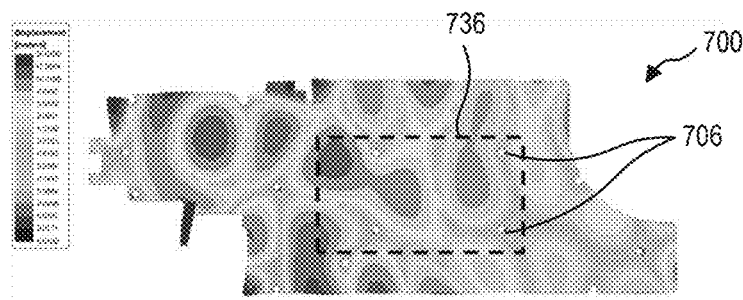
Figures 2, 10:
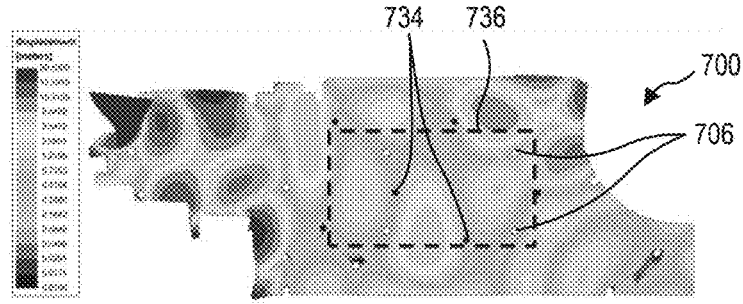

FIG. 8-1 and FIG. 8-2 illustrate the results of acoustic vibration simulations of a $10^{th}$ harmonic mode. The amplitude of the acoustic vibrations within the area of interest 736 are reduced by the introduction of noninvasive fixation points 734 in FIG. 8-2. Similarly, FIG. 9-1 and FIG. 9-2 illustrate reduction in acoustic vibration amplitude in the area of interest 736 in the $20^{th}$ harmonic mode. The amplitude of the acoustic vibrations within the area of interest 736 are reduced by the introduction of noninvasive fixation points 734 between FIG. 9-1 and FIG. 9-2. Finally, the acoustic vibration simulation of the $32^{nd}$ harmonic mode for the PCB 700 also shows a reduction in acoustic vibration amplitudes in the area of interest 736 by the introduction of noninvasive fixation points 734 between FIG. 10-1 and FIG. 10-2. By reducing the amplitude of the acoustic vibrations in the area of interest 736, in some embodiments, the loudness of the PCB 700 in the electronic device is reduced.

Figure 11:
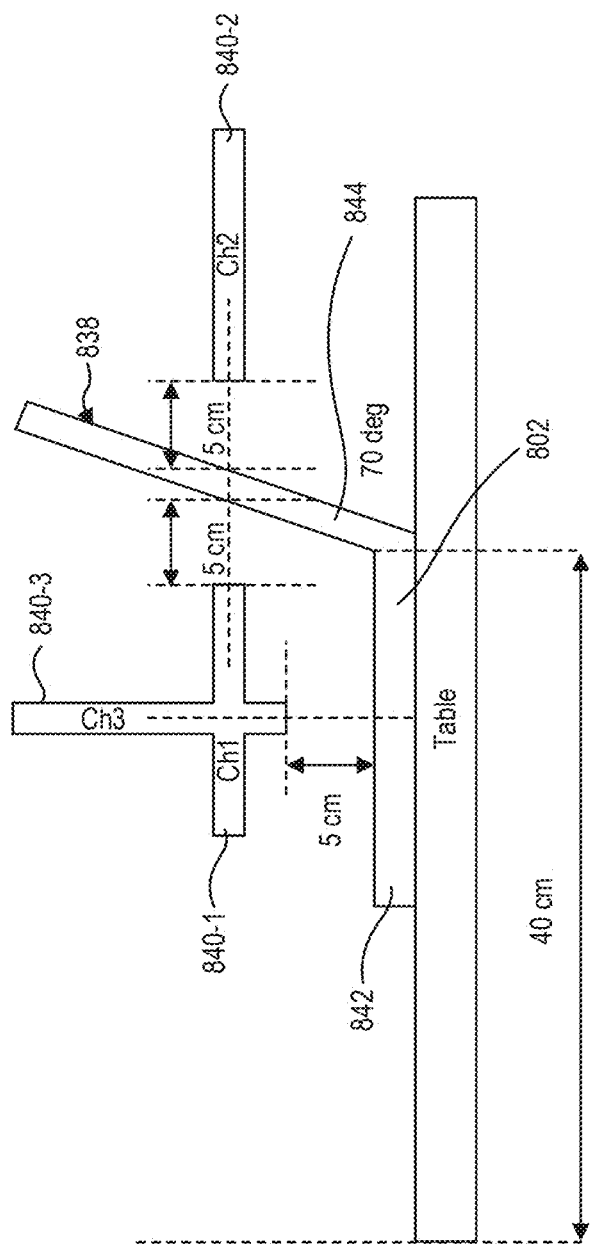
FIG. 11 is a schematic illustration of a test setup to measuring acoustic performance, according to at least one embodiment of the present disclosure.

FIG. 11 is a schematic illustration of an acoustic testing system used to measure the loudness of a PCB, such as the PCB 700 of FIG. 7 through FIG. 10-2, in an electronic device 838, such as a laptop computer. The loudness of the laptop device 838 was measured using three microphones including a first channel microphone 840-1, a second channel microphone 840-2, and a third channel microphone 840-3. The first channel microphone 840-1 is positioned and oriented toward a display portion 844 of the electronic device 838 to measure the sound directed at a user by the display portion 844. The second channel microphone 840-2 is positioned and oriented toward a rear surface of the display portion 844 of the electronic device to measure the sound directed outward to other individuals in around the electronic device 838. The third channel microphone 840-3 is positioned and oriented toward a base 842 of the electronic device 838 to measure the sound directed upward at a user from the base 842. The display portion 844 is positioned at a 700 angle relative to the surface the electronic device 838 is resting on.

Figure 12:
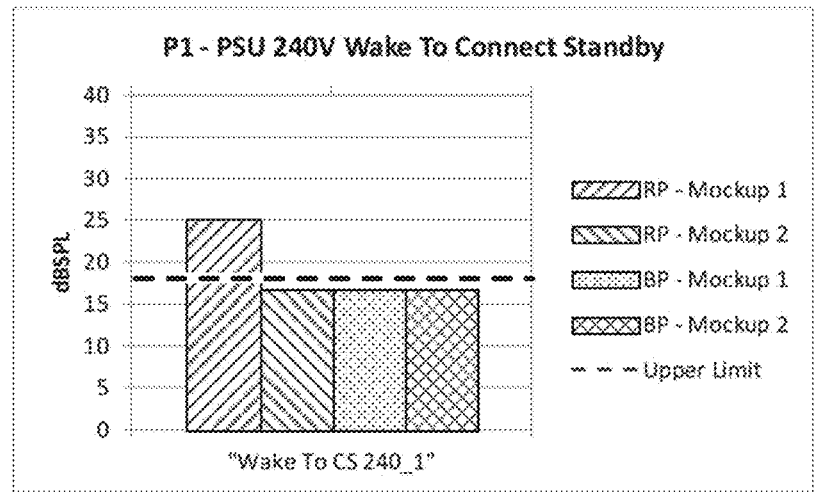
FIG. 12 is set of graphs illustrating the results of the test setup of FIG. 11.
Figure 12:
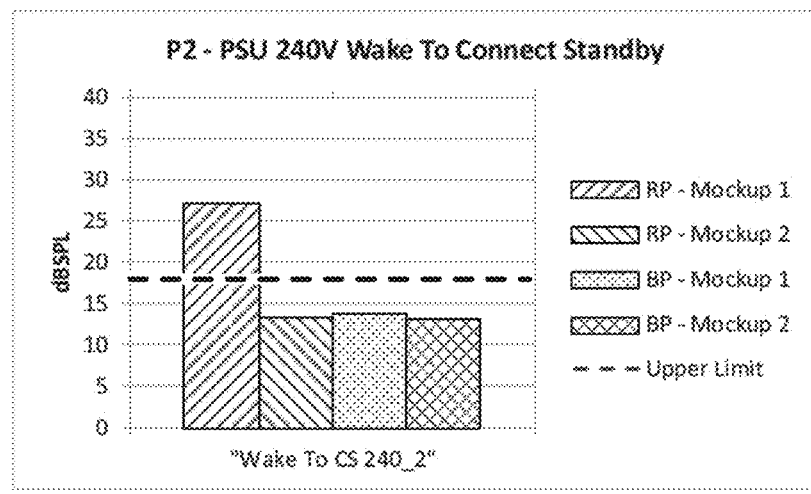
Figure 12:
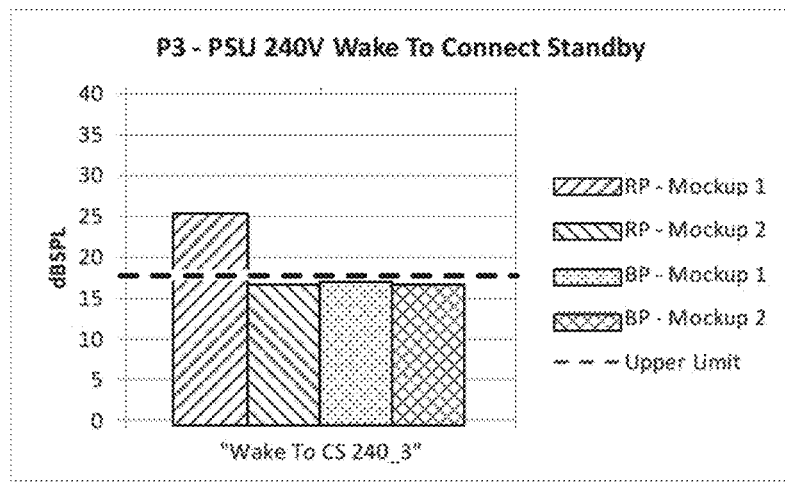

FIG. 12 is a set of graphs illustrating test results of the testing system of FIG. 11. In particular, a "wake to connect standby" test was conducted using an electronic device including a PCB affixed with only invasive fasteners in through-holes (Mockup 1), such as described in relation to FIG. 7. The "wake to connect standby" was repeated using a PCB affixed with both invasive fasteners and noninvasive fasteners to provide additional vibration reduction on the PCB (Mockup 2), such as described in relation to FIG. 7, also. The "wake to connect standby" test conducted using different power modes of the electronic components of the PCB: recommended performance (RP) power mode and best performance (BP) power mode.

In both modes, all three channel microphones recorded at reduction in audible noise from the PCB and electronic device 838 of FIG. 11. In particular, the RP power mode with the conventional invasive fasteners produced at least 8 decibel (dB) louder noise than the RP power mode with noninvasive fasteners added. While the BP power mode recorded less of a noise reduction than the RP power mode, a noise reduction was measured.

In other tests and benchmarking applications, additional improvements were measured. For example, during a set of "GPU Geek" tests, which are particularly demanding on system resources, an approximate 30% reduction in loudness (0.42 Sones to 0.32 Sones) was measured.

Figure 13:
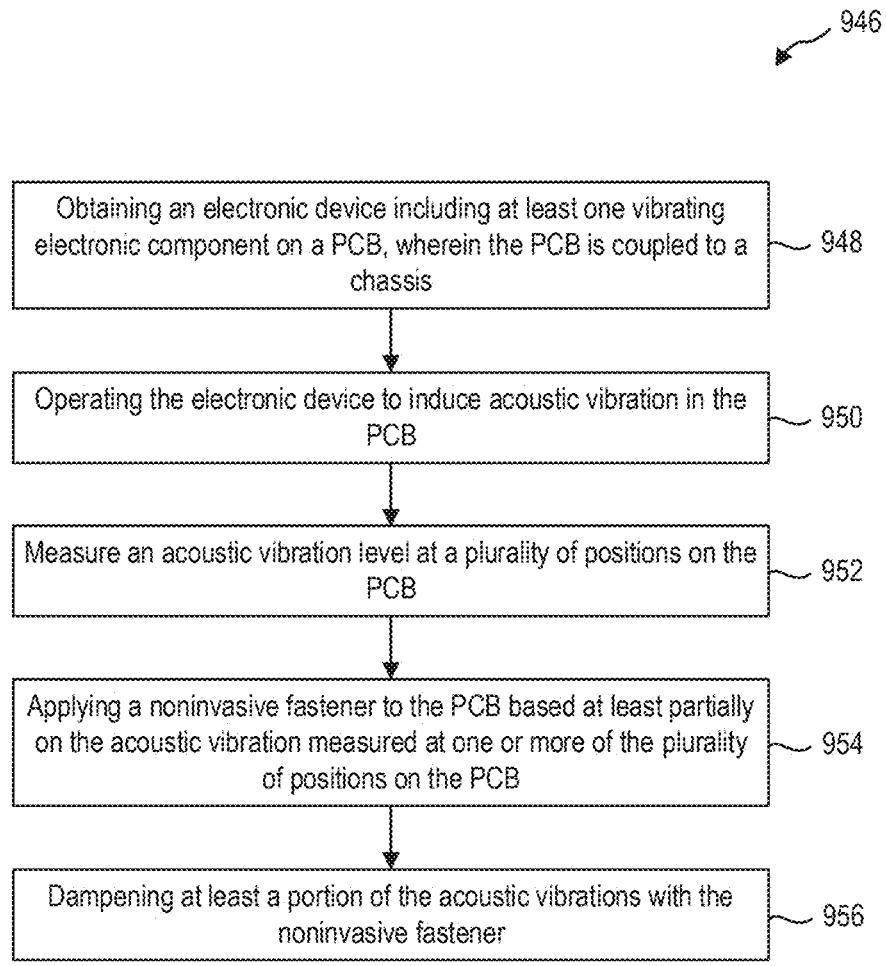
FIG. 13 is a flowchart illustrating a method of reducing acoustic vibration in an electronic device.

FIG. 13 is a flowchart illustrating an embodiment of a method 946 of reducing acoustic vibration in an electronic device. The method 946, in some embodiments, includes obtaining an electronic device including at least one vibration source electronic component on a PCB, and the PCB is coupled to a chassis of the electronic device at 948. In some embodiments, the PCB is coupled to the chassis with one or more invasive fasteners through the PCB. In some embodiments, the PCB is coupled to the chassis with one or more noninvasive fasteners. The method 946 further includes operating the electronic device to induce acoustic vibration in the PCB at 950. Different operations, tests, and benchmarks operate the vibration source differently, and, in some embodiments, operating the electronic device to induce acoustic vibration in the PCB at 950 includes performing a plurality of operations, tests, benchmarks, or combinations thereof. In some embodiments, operating the electronic device may be performed by operation of a physical example of the electronic device, or operating the electronic device may be performed by executing a simulation of the electronic device under a variety of conditions.

In some embodiments, the method 946 further includes measuring an acoustic vibration level at a plurality of positions on the PCB at 952. In some embodiments, the acoustic vibration level is measured with a potentiometer, laser, or other sensor to measure displacement of the PCB relative to a chassis. In some embodiments, the acoustic vibration level is measured with a microphone to measure loudness levels of the PCB moving relative to a chassis. In some embodiments, the acoustic vibration level is measured by computer simulation of a displacement of the PCB relative to a chassis.

The method 946 further includes, in some embodiments, applying a noninvasive fastener to a surface of the PCB based at least partially on the acoustic vibration measured at one or more of the plurality of positions on the PCB at 954. In some embodiments, applying a noninvasive fastener to the surface of the PCB includes positioning the noninvasive fastener at the point of highest vibration measured. In some embodiments, applying a noninvasive fastener to the surface of the PCB includes positioning a plurality of noninvasive fasteners equidistance from the point of highest vibration. In some embodiments, applying a noninvasive fastener to the surface of the PCB includes identifying a vibration source associated the with acoustic vibration and positioning at least one noninvasive fastener overlapping at least one vibration source.

In some embodiments, applying a noninvasive fastener to the surface of the PCB includes integrally forming one portion of the noninvasive fastener with the PCB and/or the mechanical ground. In some embodiments, applying a noninvasive fastener to the surface of the PCB includes adhering the noninvasive fastener to the surface of the PCB with an adhesive. In some embodiments, applying a noninvasive fastener to the surface of the PCB includes bonding a material of the noninvasive fastener directly to the surface. In some embodiments, applying a noninvasive fastener to the surface of the PCB includes fixing the noninvasive fastener to one of the PCB and the mechanical ground and then affixing the PCB to the mechanical ground with conventional screws through a through-hole in the PCB. In some embodiments, applying a noninvasive fastener to the surface of the PCB includes affixing an assembled noninvasive fastener, with a first portion and a second portion, to one of the PCB and the mechanical ground before compressing the assembled noninvasive fastener between the PCB and the mechanical ground.

The method 946 further includes dampening at least a portion of the acoustic vibrations with the noninvasive fastener at 956. Noninvasive fasteners, according to at least some embodiments of the present disclosure, can improve acoustic performance of an electronic device without damaging or interfering with electronic components or positioning of electronic components on a PCB and can allow greater freedom in both PCB design and chassis design.

INDUSTRIAL APPLICABILITY

The present disclosure relates generally to systems and methods for reducing acoustic vibration in an electronic device. More particularly, the present disclosure relates to reducing acoustic vibrations in a printed circuit board (PCB) caused by one or more electronic components affixed to the PCB deforming. In some embodiments, multi-layer chip capacitors (MLCC) and other components of the electronic device deform as electric fields are applied to the components. For example, the capacitor dielectric layers can deform in response to a change in the electric field direction, causing an MLCC surface to repeatedly shrink and expand with an applied alternating current (AC) voltage. This vibration event can transfer to the PCB substrate via solder or other attachment mechanisms.

In some embodiments, the vibration source is a processor, such as a central processing unit (CPU), a graphical processing unit (GPU); a storage device, such as random-access memory (RAM), other volatile memory, nonvolatile memory, or combinations thereof, a network device; a power source; or other components of the electronic device. In some processors, a fully integrated switching regulator is integrated inside of a CPU or GPU. In some scenarios of CPU/GPU load, the integrated switching regulator's switching behavior falls into an acoustic range. In such scenarios, the PCB-mounted ceramic capacitors used for those integrated switching regulators vibrate. In some embodiments, such an integrated switching regulator uses ceramic decoupling capacitors and locates them underneath the CPU package or GPU package, which can be a vibration source. The processor load, in some cases, is electrically very hard to control and/or out of control.

Because the electronic components expand and shrink with AC voltage, the movement of the electronic component can be translated into flex of the PCB. In some instances, the flex of the PCB can produce harmonic effects or other acoustic vibrations, such as in a range of 20 Hertz (Hz) to 20000 Hz, some of which may be audible to a user. Because the acoustic vibrations are harmonic effects of the combination of the electronic components on the PCB and the previously chosen fixation points to the chassis (e.g., screw locations to the chassis mounts), correcting the acoustic vibrations can be difficult.

In some embodiments, a noninvasive fastener according to the present disclosure allows the dampening of vibration in both tension and compression at substantially any location on the PCB without requiring a through-hole used in a conventional chassis mount location.

In some embodiments, a PCB is fixed to a chassis by screws. The screws are located in through-holes through the PCB to mount the PCB to the chassis. Vibration sources, on both sides of the PCB, can flex the PCB and introduce acoustic vibrations. The screws through the PCB act as anchored points about the vibration modes of the PCB can oscillate. The vibration sources include, in various embodiments, an MLCC, one or more capacitors such as decoupling capacitors, integrated switching regulators, voltage regulation modules (VRM), other integrated circuit (IT) devices, and other electronic components with AC voltages. The vibration sources can create harmonic oscillations in the PCB relative to the screws that create audible noise for a user.

The harmonic oscillations can be reduced by limiting and/or preventing movement of the PCB relative to the chassis. In some embodiments, a supplementary through-hole can fix a portion of the PCB to the chassis with a supplementary screw in addition to the pre-existing screws. The MLCC and/or capacitor(s) are located proximate to the supplementary screw, but the MLCC and/or capacitor(s) remain positioned between fixation points of the PCB, allowing the PCB to flex and oscillate between the fixation points (e.g., pre-existing screw(s) and supplementary screw (s)).

In some embodiments, each supplementary screw and/or through-hole consumes area on the PCB, which is needed to make the PCB and associated electronic device as small as possible for design, efficiency, and portability. In some embodiments, the PCB and electronic components connected thereto have an existing design, layout, and fabrication process, and adding supplementary through-hole is not a viable option due to time constraints or economic constraints.

At least some embodiments of a noninvasive fastener according to the present disclosure can provide greater flexibility in placement and/or performance than adding a supplementary through-hole, which allows for greater reduction in acoustic vibration.

A noninvasive fastener, in some embodiments, is fastened to a surface of the PCB without a through-hole. In some embodiments, the noninvasive fastener has a connection strength with the surface of the PCB of at least 200 pounds per square inch (psi). In some embodiments, the noninvasive fastener has as connection strength with a surface of the mechanical ground of at least 200 psi. In some embodiments, the noninvasive fastener has as connection strength with both the surface of the PCB and the surface of the mechanical ground of at least 200 psi.

The noninvasive fastener may be fastened to the surface of the PCB and/or the mechanical ground through a variety of connection methods. In some embodiments, the noninvasive fastener is fastened to the PCB with an adhesive therebetween. In some embodiments, the noninvasive fastener is fastened to the PCB by a magnetic attraction. In some embodiments, the noninvasive fastener is fastened to the PCB by an adherence of the noninvasive fastener itself, such as an elastomeric noninvasive fastener that bonds directly to the surface of the PCB without an additional adhesive.

In some embodiments, the noninvasive fastener is affixed to any portion of the surface of the PCB and does not require a through-hole through the PCB. Because a noninvasive fastener according to the present disclosure does not require a through-hole, the noninvasive fastener is connectable to a surface of the PCB directly opposite a vibration source. In other words, a noninvasive fastener can be positioned underneath a vibration source and dampen acoustic vibration of the vibration source, such as an MLCC or capacitor that cannot have a screw or other invasive fastener positioned therethrough.

In some embodiments, the noninvasive fastener is a mechanical fastener that includes a mechanical connection between a first portion and second portion of the noninvasive fastener. In some examples, the mechanical connection is a snap fit that allows the first portion of the noninvasive fastener to be fastened to a surface of the PCB and a second portion of the noninvasive fastener to be fastened to the mechanical ground.

In some embodiments, the first portion and second portion of the noninvasive fastener are positioned on the PCB and mechanical ground (e.g., the chassis) prior to assembly of the PCB in the chassis. In some embodiments, a snap fit noninvasive fastener can allow the PCB to be selectively installed, removed, repaired, or replaced from the chassis and/or electronic device without damaging the noninvasive fastener and replacing the noninvasive fastener.

In some embodiments, the noninvasive fasteners (e.g., a first portion of the noninvasive fastener) are positioned on one side of the PCB to selectively fasten the PCB to the mechanical ground upon installation of the PCB in the chassis. In some embodiments, the noninvasive fasteners are positioned on both sides of the PCB to allow the PCB to be fixed to a plurality of mechanical grounds (e.g., the chassis and the cover) while still allowing the cover, PCB, and chassis to be separated for repairs and/or maintenance of the electronic device.

The noninvasive fastener with a first portion and a second portion, in some embodiments, includes different materials for the first portion and the second portion. For example, a first portion may be an elastomeric material that is vibration dampening to limit and/or prevent transmission of acoustic vibrations from the PCB to the chassis, and the second portion may be a rigid material, such as metal, that allows for increased durability. In such an embodiment, the first portion can be fastened to the PCB with an adhesive therebetween, while the second portion can be welded to the chassis. In other embodiments, the chassis is a milled or machined bucket, and the second portion of the noninvasive fastener is integrally formed with the chassis when the chassis is milled or machined from a billet.

As described herein, the noninvasive fastener has a connection tensile strength of at least 200 psi with a surface of the PCB and with the mechanical ground. The tensile strength of the snap fit connection therebetween is less than the connection strength, but no less than 160 psi. Such embodiments of a tensile strength of the snap fit allows dampening of the vibration in both compression and tension, while enabling the first portion and second portion of the noninvasive fastener to be disconnected upon repair or replacement of the PCB.

In some embodiments, the noninvasive fastener is an elastomeric fastener that bonds to one or more of the PCB and the mechanical ground, and the elastomeric material is vibration dampening. In some embodiments, the noninvasive fasteners are positioned on one side of the PCB to selectively fasten the PCB to the mechanical ground. In some embodiments, the noninvasive fasteners are positioned on both sides of the PCB to allow dampening in compression and tension simultaneously. For example, a noninvasive fastener is fastened to a first surface of the PCB proximate a chassis, and another noninvasive fastener is fastened on a second surface of the PCB opposite the first surface and proximate a cover. In some embodiments, the noninvasive fasteners are directly opposite one another. In some embodiments, the noninvasive fasteners are positioned on opposite sides but laterally displaced from one another.

The noninvasive fastener, in some embodiments, is a singular piece of elastomeric material. In other embodiments, the noninvasive fastener is partially an elastomeric material and a partially a rigid material, such as a PCB spacer or motherboard spacer. The rigid material can provide additional strength and/or laterally stability to the noninvasive fastener. In some examples, the rigid material increases the shear strength of the noninvasive fastener.

The noninvasive fastener may be made of or include polymers, such as ethylene vinyl acetate, styrene-isoprene-styrene, styrene-butadiene-styrene, polyethylene, polyamides, ethylene acrylic copolymers, polypropylenes, phenoxy resins, polyesters, polyesteramides, polyurethanes, butyl rubbers, polyvinyl acetate, etc. In some embodiments, the noninvasive fastener includes or is made of a hot-melt adhesive. The hot-melt adhesive has a melting temperature of no less than 90° C. In some embodiments, the noninvasive fastener is adhered to the mechanical ground with a separate adhesive with a melting temperature no less than 90° C.

In some embodiments, the connection tensile strength of the noninvasive fastener to the PCB is at least 200 psi. In some embodiments, the connection tensile strength of the noninvasive fastener to the PCB is at least 300 psi. In some embodiments, the connection tensile strength of the noninvasive fastener to the PCB is at least 400 psi.

In some embodiments, the connection tensile strength of the noninvasive fastener to the mechanical ground (e.g., chassis, cover) is at least 200 psi. In some embodiments, the connection tensile strength of the noninvasive fastener to the mechanical ground is at least 300 psi. In some embodiments, the connection tensile strength of the noninvasive fastener to the mechanical ground is at least 400 psi.

In some embodiments, the tensile strength of the noninvasive fastener is less than the connection tensile strength of the noninvasive fastener to the surfaces. In some embodiments, the tensile strength of the noninvasive fastener is at least 160 psi. In some embodiments, the tensile strength of the noninvasive fastener is at least 200 psi. In some embodiments, the tensile strength of the noninvasive fastener is at least 250 psi.

Depending on the material of the cover and/or the chassis, the type of noninvasive fastener and/or the type of connection between the noninvasive fastener and the PCB and mechanical ground can be different. In at least one example, a PCB is connected to the chassis with a different type of noninvasive fastener than the PCB is connected to a cover. In another example, noninvasive fastener is connected to the PCB with a different connection type than the noninvasive fastener is connected to the mechanical ground.

The noninvasive fasteners may be fastened to a surface of the PCB without a through-hole in the PCB, however, in some embodiments, the noninvasive fasteners include at least a portion that is positioned in a through-hole in the mechanical ground.

In some embodiments, the intended fixation point on the PCB is not able to have a through-hole positioned therein to receive a conventional screw fastener, but the chassis or cover can have a through-hole therein. In some embodiments, a first portion of a first noninvasive fastener is bonded directly to a surface of the PCB, such as when the first portion of the first noninvasive fastener is or includes an elastomeric material. The first portion of the first noninvasive fastener has a mechanical connection, such as threads, thereon, to which the second portion of the first noninvasive fastener can mechanically connect. In some embodiments, the second portion of the first noninvasive fastener is a screw that is inserted through the chassis to thread into and mechanically connect with the first portion of the first noninvasive fastener.

The second noninvasive fastener also includes a second portion that is a screw, and the first portion of the second noninvasive fastener is fastened to the PCB with an adhesive layer therebetween. For example, the surface material or finish of a first surface of the PCB can be different from the surface material or finish of an opposite second surface of the PCB. The elastomeric material of the first portion of the second noninvasive fastener may not bond with a connection tensile strength of at least 200 psi, and the adhesive layer can provide a stronger connection tensile strength between the second surface and the first portion of the second noninvasive fastener.

In some embodiments, the noninvasive fastener is configured to facilitate assembly of the electronic device. For example, the PCB is fastened to the chassis using a plurality of screws through the PCB into the chassis. Because the PCB exhibits acoustic vibration, a noninvasive fastener is connected between the PCB and a cover. The cover is installed after the PCB is affixed to the chassis.

In some embodiments, a first portion of the noninvasive fastener is fastened to the PCB, and a second portion of the noninvasive fastener is fastened to the cover. During assembly (or reassembly) of the electronic device, the cover is subsequently installed over the PCB and pressed downward toward the PCB. The first portion of the noninvasive fastener complementarily mates with the second portion of the noninvasive fastener in a press fit and/or friction fit. A force applied to the cover to assemble the electronic device also urged the first portion and second portion of the noninvasive fastener into mechanical connection, which fastens the PCB to the cover to reduce acoustic vibration in the PCB. In devices with known acoustic vibrations, such a noninvasive fastener positioning and assembly process can allow some embodiments of noninvasive fasteners according to the present disclosure to be retrofit onto the existing electronic device, improving the acoustic performance of the device without requiring a redesign of the PCB or chassis.

In some embodiments, a processor is positioned on the PCB between the through-holes for invasive fasteners, because the invasive fasteners cannot by located overlapping the processor in the plane of the PCB. In some embodiments, one or more noninvasive fixation points are positioned at least partially overlapping a vibration source, such as a processor, on a PCB. In some examples, a noninvasive fixation point is at least partially overlapping a vibration source when part of the noninvasive fixation point is within the area of the vibration source on the plane of the PCB. The plane of the PCB should be understood to be the plane in which the surface of the PCB lies. In some embodiments, a PCB may be nonplanar, in which case, the plane of the PCB should be understood to follow at least one curve or discontinuity of the nonplanar PCB.

A method of reducing vibration in an electronic device, in some embodiments, includes obtaining an electronic device including at least one vibration source electronic component on a PCB, and the PCB is coupled to a chassis of the electronic device. In some embodiments, the PCB is coupled to the chassis with one or more invasive fasteners through the PCB. In some embodiments, the PCB is coupled to the chassis with one or more noninvasive fasteners. The method further includes operating the electronic device to induce acoustic vibration in the PCB. Different operations, tests, and benchmarks operate the vibration source differently, and, in some embodiments, operating the electronic device to induce acoustic vibration in the PCB includes performing a plurality of operations, tests, benchmarks, or combinations thereof. In some embodiments, operating the electronic device may be performed by operation of a physical example of the electronic device, or operating the electronic device may be performed by executing a simulation of the electronic device under a variety of conditions.

In some embodiments, the method further includes measuring an acoustic vibration level at a plurality of positions on the PCB. In some embodiments, the acoustic vibration level is measured with a potentiometer, laser, or other sensor to measure displacement of the PCB relative to a chassis. In some embodiments, the acoustic vibration level is measured with a microphone to measure loudness levels of the PCB moving relative to a chassis. In some embodiments, the acoustic vibration level is measured by computer simulation of a displacement of the PCB relative to a chassis.

The method further includes, in some embodiments, applying a noninvasive fastener to a surface of the PCB based at least partially on the acoustic vibration measured at one or more of the plurality of positions on the PCB. In some embodiments, applying a noninvasive fastener to the surface of the PCB includes positioning the noninvasive fastener at the point of highest vibration measured. In some embodiments, applying a noninvasive fastener to the surface of the PCB includes positioning a plurality of noninvasive fasteners equidistance from the point of highest vibration. In some embodiments, applying a noninvasive fastener to the surface of the PCB includes identifying a vibration source associated the with acoustic vibration and positioning at least one noninvasive fastener overlapping at least one vibration source. In some embodiments, applying a noninvasive fastener to the surface of the PCB includes integrally forming one portion of the noninvasive fastener with the PCB and/or the mechanical ground. In some embodiments, applying a noninvasive fastener to the surface of the PCB includes adhering the noninvasive fastener to the surface of the PCB with an adhesive. In some embodiments, applying a noninvasive fastener to the surface of the PCB includes bonding a material of the noninvasive fastener directly to the surface. In some embodiments, applying a noninvasive fastener to the surface of the PCB includes fixing the noninvasive fastener to one of the PCB and the mechanical ground and then affixing the PCB to the mechanical ground with conventional screws through a through-hole in the PCB.

The method further includes dampening at least a portion of the acoustic vibrations with the noninvasive fastener. Noninvasive fasteners, according to at least some embodiments of the present disclosure, can improve acoustic performance of an electronic device without damaging or interfering with electronic components or positioning of electronic components on a PCB and can allow greater freedom in both PCB design and chassis design.

The present disclosure relates to systems and methods for reducing acoustic vibrations in an electronic device according to at least the examples provided in the sections below:

[A1] In some embodiments, a device for reducing acoustic vibration in an electronic device includes a noninvasive fastener configured to fix a printed circuit board (PCB) to a mechanical ground, and the noninvasive fastener provides vibrational dampening in both compression and tension.

[A2] In some embodiments, the noninvasive fastener of [A1] includes an elastomeric material.

[A3] In some embodiments, the noninvasive fastener of [A1] includes a mechanical fastener.

[A4] In some embodiments, the mechanical fastener of [A3] includes a snap fit between a first portion of the mechanical fastener and a second portion of the mechanical fastener.

[A5] In some embodiments, the noninvasive fastener any of [A1] through [A4] includes a magnetic connection.

[A6] In some embodiments, the noninvasive fastener of any of [A1] through [A5] includes an adhesive configured to adhere to a surface of the PCB.

[A7] In some embodiments, the adhesive of [A6] has a melting point no less than 90° C.

[A8] In some embodiments, the noninvasive fastener of any of [A1] through [A7] includes an elastomeric portion and a rigid portion.

[A9] In some embodiments, the noninvasive fastener of any of [A1] through [A8] has a tensile strength greater than 200 pounds per square inch (psi).

[B1] In some embodiments, a system for reducing acoustic vibrations in an electronic device includes a first chassis portion, a PCB, and a noninvasive fastener. The PCB is fixed to the first chassis portion. The noninvasive fastener is fastened to a surface of the PCB. The noninvasive fastener is configured to dampen an acoustic vibration of the PCB relative to the first chassis portion in both compression and tension.

[B2] In some embodiments, the noninvasive fastener of [B1] has a connection tensile strength greater than 160 psi.

[B3] In some embodiments, the noninvasive fastener of [B1] or [B2] is fixed to the PCB and to a second chassis portion opposite the first chassis portion.

[B4] In some embodiments, the system of [B3] includes a second noninvasive fastener fastened to the PCB and the first chassis portion.

[B5] In some embodiments, the noninvasive fastener of [B1] is fixed to the PCB without being located through a through-hole in the PCB.

[B6] In some embodiments, the PCB of any of [B1] through [B5] includes a processor connected to the PCB, and the noninvasive fastener is located overlapping the processor in a plane of the PCB.

[C1] In some embodiments, a method of reducing acoustic vibrations in an electronic device includes obtaining an electronic device including at least one vibrating electronic component on a PCB, wherein the PCB is coupled to a chassis, operating the electronic device to induce acoustic vibration in the PCB, measuring an acoustic vibration level at a plurality of positions on the PCB, applying a noninvasive fastener to the PCB based at least partially on the acoustic vibration level measured at one or more of the plurality of positions on the PCB, and dampening at least a portion of the acoustic vibrations with the noninvasive fastener.

[C2] In some embodiments, the noninvasive fastener of [C1] is applied to the PCB overlapping at least a portion of the at least one vibrating electronic component.

[C3] In some embodiments, the noninvasive fastener of [C1] is applied to the PCB on an opposite side of the PCB from the at least one vibrating electronic component.

[C4] In some embodiments, applying the noninvasive fastener of any of [C1] through [C3] includes affixing an assembled noninvasive fastener to one of the PCB and the chassis, and compressing the assembled noninvasive fastener between the PCB and the chassis by fixing the PCB to the chassis.

[C5] In some embodiments, applying the noninvasive fastener of any of [C1] through [C3] includes integrally forming at least a portion of the noninvasive fastener with at least one of the chassis and the PCB.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device for reducing acoustic vibration in an electronic device, the device comprising:
    a noninvasive fastener configured to fix a printed circuit board (PCB) to a mechanical ground, wherein the noninvasive fastener provides vibrational dampening in compression and tension, wherein the noninvasive fastener includes an elastomeric portion and a rigid portion and the noninvasive fastener has a connection tensile strength to the PCB and to the mechanical ground greater than 200 pounds per square inch (psi), wherein the noninvasive fastener is configured to fix a printed circuit board (PCB) to a mechanical ground without a through-hole.

2. The device of claim 1, wherein the noninvasive fastener includes an elastomeric material.

3. The device of claim 1, wherein the noninvasive fastener includes a mechanical fastener.

4. The device of claim 3, wherein a first portion of the noninvasive fastener is configured to be fixed to the PCB and a second portion of the noninvasive fastener is configured to be fixed to the mechanical ground, wherein the mechanical fastener includes a snap fit between the first portion of the mechanical fastener and the second portion of the mechanical fastener.

5. The device of claim 1, wherein the noninvasive fastener includes a magnetic connection.

6. The device of claim 1, wherein the noninvasive fastener includes an adhesive configured to adhere to a surface of the PCB.

7. The device of claim 6, wherein the adhesive has a melting point no less than 90° C.

8. The device of claim 1, wherein the noninvasive fastener has a tensile strength greater than 300 pounds per square inch (psi).

9. The device of claim 8, wherein the connection tensile strength of the noninvasive fastener to the mechanical ground is at least 300 psi.

10. The device of claim 9, wherein the connection tensile strength of the noninvasive fastener to the PCB is at least 400 psi.

11. The device of claim 9, wherein the connection tensile strength of the noninvasive fastener to the PCB is at least 200 psi.

12. The device of claim 1, wherein the elastomeric portion of the noninvasive fastener complementarily mates with the rigid portion of the noninvasive fastener in a press fit and/or friction fit.

13. A system for reducing acoustic vibrations in an electronic device, the system comprising:
    a first chassis portion;
    a printed circuit board (PCB) fixed to the first chassis portion; and
    the noninvasive fastener of claim 1 fastened to a surface of the PCB and configured to dampen an acoustic vibration of the PCB relative to the first chassis portion in both compression and tension.

14. The system of claim 13, wherein the noninvasive fastener has a tensile strength greater than 160 psi.

15. The system of claim 13, wherein the noninvasive fastener is fixed to the PCB and to a second chassis portion opposite the first chassis portion.

16. The system of claim 15, further comprising a second noninvasive fastener fastened to the PCB and the first chassis portion.

17. The system of claim 15, wherein the noninvasive fastener is fixed to the PCB without being located through a through-hole in the PCB.

18. The system of claim 13, wherein the PCB includes a processor connected to the PCB, and the noninvasive fastener is located overlapping the processor in a plane of the PCB.

19. The system of claim 13, wherein the noninvasive fastener includes an elastomeric portion and a rigid portion, wherein the elastomeric portion of the noninvasive fastener complementarily mates with the rigid portion of the noninvasive fastener in a press fit and/or friction fit.

20. The system of claim 13, wherein the noninvasive fastener is a first type of noninvasive fastener and further comprising a second noninvasive fastener, the second noninvasive fastener being a second type of noninvasive fastener different from the first type of noninvasive fastener.

21. The system of claim 20, further comprising a third noninvasive fastener, the third noninvasive fastener being a third type of noninvasive fastener different from the first type of noninvasive fastener and the second type of noninvasive fastener.

\* \* \* \* \*